United States Patent [19]
Ogawa et al.

[11] Patent Number: 5,275,972
[45] Date of Patent: Jan. 4, 1994

[54] METHOD FOR FABRICATING A SEMICONDUCTOR INTEGRATED CIRCUIT DEVICE INCLUDING THE SELF-ALIGNED FORMATION OF A CONTACT WINDOW

[75] Inventors: Hisashi Ogawa, Katano; Yasushi Naito, Toyonaka; Masanori Fukumoto, Osaka, all of Japan

[73] Assignee: Matsushita Electric Industrial Co., Ltd., Kadoma, Japan

[21] Appl. No.: 930,485

[22] Filed: Aug. 14, 1992

Related U.S. Application Data

[63] Continuation of Ser. No. 656,948, Feb. 15, 1991, abandoned.

[30] Foreign Application Priority Data

Feb. 19, 1990 [JP] Japan .................................. 2-37626

[51] Int. Cl.$^5$ .................... H01L 21/283; H01L 21/31
[52] U.S. Cl. ...................................... 437/195; 437/40; 437/52; 437/228; 437/978; 437/984; 437/982; 156/644; 156/653
[58] Field of Search .................... 437/195, 52, 978, 228, 437/984, 40, 982; 156/653, 644

[56] References Cited

U.S. PATENT DOCUMENTS

| | | | |
|---|---|---|---|
| 4,824,767 | 4/1989 | Chambers et al. | 430/313 |
| 4,876,983 | 10/1989 | Fukuda et al. | 118/722 |
| 4,996,167 | 2/1991 | Chen | 437/40 |
| 5,037,777 | 8/1991 | Mele et al. | 437/195 |
| 5,043,298 | 8/1991 | Yamada et al. | 437/52 |
| 5,063,176 | 11/1991 | Lee et al. | 437/195 |
| 5,077,238 | 12/1991 | Fujii et al. | 437/228 |

OTHER PUBLICATIONS

Wolf, S., et al., Silicon Processing, vol. 1, 1986, Lattice Press, pp. 529-534, 539-556.
1987 Symposium of VLSI Technology, Digest of Tech. Papers, pp. 93-94 "A High Density 4M bit . . . ", Küsters et al.
Extended Abstracts of the 22nd (1990 International) Conference of Solid State Devices and Materials, Sendai, 1990, pp. 401-404, "Limitations of Trench Cell Process Technologies for Submicron DRAMs", Anens et al.
Extended Abstracts of the 22nd (1990 International) Conference of Solid State Devices and Materials, Sendai, 1990, pp. 829-832, "Advanced Process Features for High Density DRAMs", Beinvogl et al.

Primary Examiner—T. N. Quach
Attorney, Agent, or Firm—Ratner & Prestia

[57] ABSTRACT

A fabrication method for a semiconductor integrated circuits which permits the self-aligned formation of contact windows without causing shorts or breaks in the interconnecting lines in the device is provided. After forming gate electrodes and source/drain regions of transistors on a semiconductor substrate, an etch-stop layer and a BPSG film are successively deposited over the gate electrodes and the source/drain regions. After a resist having a contact window pattern is formed on the BPSG film, an isotropic dry etching using a microwave plasma is performed to etch the BPSG film. According to the isotropic dry etching, the laterally etching rate in the BPSG film can be controlled by adjusting the RF power, and a silicon dioxide film can be used as the etch stop layer. After the BPSG flow process, the etch stop layer on the contact region is etched away to form contact windows.

10 Claims, 13 Drawing Sheets

METHOD FOR FABRICATING A SEMICONDUCTOR INTEGRATED CIRCUIT DEVICE INCLUDING THE SELF-ALIGNED FORMATION OF A CONTACT WINDOW

This application is a continuation of application Ser. No. 07/656,948 filed Feb. 15, 1991 abandoned.

BACKGROUND OF THE INVENTION

1. Field of the Invention

The present invention relates to a method for fabricating a semiconductor integrated circuit device, and more particularly to a fabrication method that permits the self-aligned formation of a contact window in a semiconductor integrated circuit device.

2. Description of the Prior Art

A method of the self-aligned formation of a contact window is known for forming a fine-featured contact window reaching down a semiconductor substrate through an insulating film covering transistor devices integrated in high density on the semiconductor substrate. According to this method, in order to form a contact on a small area of a substrate flanked by electrodes of transistor devices, an insulating film is etched using a mask having an opening larger than that small area to form a contact window in self-aligning fashion with respect to the electrodes. The contact made between the semiconductor substrate and the conductive layer (conductive line) via the thus formed contact window is referred to as a "self-aligned contact".

Referring to FIGS. 9A to 9D, we will describe a prior art method for forming a contact window in self-aligning fashion with respect to gate electrodes in a dynamic random access memory (DRAM). This prior art method is known as the FOBIC method and is disclosed, for example, in Symposium VLSI Technical Digest 93 (1987).

As shown in FIG. 9A, MOSFETs are formed in a device region of a semiconductor substrate 2. Each MOSFET consists of source/drain regions 6 formed in the semiconductor substrate 2, a gate insulating film 1 on the semiconductor substrate 2, and a gate electrode 4 formed above the channel region between the source/drain regions 6. The gate electrode 4 is covered with side wall spacers 5 and an upper insulating film 8. The side wall spacers 5 and the upper insulating film 8 are formed from a silicon dioxide film. The source/drain region 6 formed in an area flanked by two gate electrodes 4 is shared by the two adjacent MOSFETs. A thin first silicon oxide film 42, a silicon nitride film 43, and a second silicon oxide film 44 are successively deposited one on top of the other on the semiconductor substrate 2 in such a way as to cover the MOSFETs, after which a resist 3 having an opening that defines the position of a contact window is formed on top of the second silicon oxide film 44 by photolithography.

Next, as shown in FIG. 9B, using the resist 3 as an etching mask, isotropic wet etching is performed to etch the portion of the second silicon oxide film 44 exposed through the opening in the resist 3, to expose the surface of the silicon nitride film 43 therebelow. Since the etchant (hydrofluoric etchant) used for etching the silicon oxide film 44 does not virtually etch silicon nitride film 43, the silicon nitride film 43 acts as an etch stop layer. Thereafter, anisotropic dry etching is performed to etch the silicon nitride film 43 and the first silicon oxide film 42, to form a contact window 50 as shown in FIG. 9C. After removing the resist 3, a bit line 12 consisting of a polycrystalline silicon film 12a and a titanium silicide film 12b is formed as shown in FIG. 9D.

According to the above prior art, since wet etching is used to etch the second silicon oxide film 44, the second silicon oxide film 44 is etched deeply in lateral directions, enlarging the inner diameter of the contact window 50. Therefore, this method is not suitable for forming a fine-featured contact window with a large aspect ratio. Also, appreciable irregularities (steps) are formed on the surface of the second silicon oxide film 44 because of the presence of the gate electrodes 4 therebeneath, the size of the steps being proportionate to the thickness of the gate electrodes 4 and the upper insulating film 8. When the bit line 12 is formed by patterning the polycrystalline silicon film 12a and the titanium silicide film 12b after depositing these conductive films 12a and 12b on the second silicon oxide film 44, failures such as breaks or shorts of the bit line 12 are likely to occur because of the irregularities on the surface of the underlying layer (second silicon oxide film 44). FIG. 10A is a plan view showing the geometry of the bit line 12. FIG. 10B is a cross section taken along line B—B in FIG. 10A. As shown in FIG. 10B, the polycrystalline silicon film 12a deposited into a narrow recessed portion formed between the two gate electrodes 4 is not easy to remove, even by selective etching for forming the bit line 12, and is likely to remain in the narrow recessed portion. The residues of the conductive substance causes the bit line 12 to short to other bit lines as shown in FIG. 10A. If the etching is performed for an extended duration of time until the polycrystalline silicon film 12a is completely removed from the recessed portion, the width of the bit line 12 will become thinner than the design value, resulting in an increased resistance or breakage of the line.

Referring to FIGS. 11A to 11D, we will describe another prior art method proposed to overcome the above problem. This prior art is disclosed in the 22nd conference on Solid State Devices and Materials.

First, after forming MOSFETs in a device region of a semiconductor substrate 2 in a similar manner to the foregoing prior art, a silicon nitride film 43, a polycrystalline silicon film 41, and a BPSG (Borophosphosilicate glass) film 11 are successively formed one on top of the other on the semiconductor substrate 2, to cover the MOSFETs. Next, a resist 3 having an opening that defines the pattern of a contact window is formed on top of the BPSG film 11 by photolithography. BPSG is a silicon oxide containing impurities (boron, phosphorus) in large quantities (on the order of a few mol %), and has properties that softens and flows when heat-treated at about 900° C. Therefore, the irregularities formed on the surface of the BPSG film 11 immediately after the deposition can be moderated by performing a heat treatment process (flow process), flattening the surface of the BPSG film 11 to a certain extent.

As shown in FIG. 11B, using the resist 3 as an etching mask, anisotropic dry etching is performed to etch the portion of the BPSG film 11 exposed through the opening in the resist 3, to expose the surface of the polycrystalline silicon film 41, an underlying layer. According to a conventional anisotropic dry etching technique, the polycrystalline silicon film 41 is resistive to etching under the conditions for etching BPSG and therefore acts as an etch stop layer. Thereafter, the polycrystalline silicon film 41 is etched by anisotropic dry etching under the conditions for etching polycrystalline silicon, to expose the surface of the silicon nitride film 43.

After removing the resist 3, pyro oxidation is performed to completely oxidize the polycrystalline silicon film 41 and transform it into a silicon dioxide film 46. At the same time, a flow process is performed to flatten the surface of the BPSG film 11. During the pyro oxidation, the silicon nitride film 43 serves to prevent the oxidation of the source/drain regions 6. After etching away the silicon nitride film 43 to open a contact window 7, a bit line 12 consisting of a polycrystalline silicon film 12a and a titanium silicide film 12b is formed.

According to the above prior art, since anisotropic dry etching is used to etch the BPSG film 11, a contact window 7 with a high aspect ratio can be formed. However, since a conductive film, i.e. the polycrystalline silicon film 41, is used as an etch stop layer during the etching of the BPSG film 11, there arises the necessity thereafter to completely oxidize the polycrystalline silicon film 41 and transform it into an insulating film (silicon dioxide film 46). If the insulation is insufficient, conductive portions having insufficient insulation will remain in the silicon dioxide film 46, and there is a possibility that the bit line 12 may short to other bit lines (not shown in FIG. 1H) via the conductive residues.

The pyro oxidation process for oxidizing the polycrystalline silicon film 41 is performed at high temperatures of approximately 900° C. Therefore, if performed for an extended duration of time, this process may lead to the oxidation of the surfaces of the source/drain regions 6 or diffusion of impurities in the semiconductor substrate, thereby changing the transistor properties. It is therefore desirable that the polycrystalline silicon film 41 be completely oxidized by the oxidation process of short duration, which requires the thickness of the polycrystalline silicon film 41 to be approximately 30 nm at the maximum.

On the other hand, if the polycrystalline silicon film 41 is thin, the polycrystalline silicon film 41 may not be able to adequately serve as an etch stop layer during the etching of the BPSG film 11, the result being that the silicon nitride film 43 below the polycrystalline silicon film 41 may be etched and, in some cases, the gate electrode 4 may be exposed. The polycrystalline silicon film 41 of the thickness thinner than approximately 50 nm will not adequately serve as an etch stop layer.

Referring to FIGS. 12A to 12C, we will described in detail some of the problems that may arise when the thickness of the polycrystalline silicon film 41 is reduced. When etching the BPSG film 11, it is necessary to shorten the etching time of the BPSG film 11 so that the thin polycrystalline silicon film 41 will not be etched. As a result, a residual portion 11a of the BPSG film 11 is left at the side of side wall spacers 5. Since the residual portion 11a acts as an etching mask during the etching of the polycrystalline silicon film 41, a residual portion 41a of the polycrystalline silicon film 41 is left below the residual portion 11a, as shown in FIG. 12A. The residual portion 41a is not completely oxidized, leaving the polycrystalline silicon film 41 partially unoxidized (this unoxidized portion is indicated by 41b in FIG. 12B). Also, partially unoxidized portions 41C are formed along both sides of the gate electrodes 4 where the contact window 7 is not formed. Accordingly, when the bit line 12 is formed thereafter, the bit line 12 shown in FIG. 12C is shorted via the residual portion 41b to another bit line (not shown in FIG. 12C) formed in parallel to that bit line 12.

If the etching of the BPSG film 11 is performed for a long duration of time, despite the thinness of the polycrystalline silicon film, to avoid the above problem, not only the polycrystalline silicon 41 but also the upper insulating film 8 therebelow and a portion of the side wall spacer 5 will be etched, as shown in FIG. 13A. This etching will also cause the surfaces of the source/drain regions 6 to be exposed. As a result, as shown in FIG. 13B, the surfaces of the source/drain regions 6 are oxidized to form an oxide layer 47 during the oxidation process for the polycrystalline silicon film 41, requiring etching to remove the oxide layer 47 on the source/drain regions 6 before forming the bit line 12. However, this etching is very likely to cause the exposure of the gate electrodes 4. An exposed gate electrode 4 would be shorted to the bit line 12, as shown in FIG. 13C.

SUMMARY OF THE INVENTION

The method for fabricating a semiconductor integrated circuit device of this invention, which overcomes the above-discussed and numerous other disadvantages and deficiencies of the prior art, comprises the steps of: forming a plurality of first conductive layers on a semiconductor substrate, each of said plurality of first conductive layers being covered with a first insulating film; forming a plurality of diffusion layers in the surface regions of said semiconductor substrate, between said plurality of first conductive layers, each of said plurality of diffusion layers functioning as a second conductive layer; forming a second insulating film over said semiconductor substrate to cover said plurality of diffusion layers and said first insulating films; forming a silicon oxide film on said second insulating film, said silicon oxide film being doped with impurities; forming an etching mask on said silicon oxide film, said etching mask having openings that define a pattern of contact windows; performing an isotropic dry etching process to remove portions of said silicon oxide film exposed through said openings in said etching mask, thereby exposing the surface of said second insulating film; performing an anisotropic dry etching process to remove portions of said second insulating film exposed through said openings in said etching mask, thereby exposing the surface of said plurality of diffusion layers and forming said contact windows; removing said etching mask; and performing a glass flow process to make said silicon oxide film soften and flow.

In a preferred embodiment, said step of forming said second insulating film comprises the steps of: forming a silicon oxide film over said semiconductor substrate; and forming a silicon nitride film on said silicon oxide film.

In a preferred embodiment, said step of forming said silicon oxide film comprises the step of forming a BPSG film on said second insulating film by a CVD technique.

In a preferred embodiment, said isotropic dry etching process is performed in a microwave plasma etching apparatus.

According to the invention, a method for fabricating a semiconductor integrated circuit device is provided, comprising the steps of: forming a plurality of first conductive layers on a semiconductor substrate, each of said plurality of first conductive layers being covered with a first insulating film; forming a plurality of diffusion layers in the surface regions of said semiconductor substrate, between said plurality of first conductive layers, each of said plurality of diffusion layers functioning as a second conductive layer; forming a second insulating film over said semiconductor substrate to cover said plurality of diffusion layers and said first insulating films; forming a silicon oxide film on said second insulating film, said silicon oxide film being doped with impurities; forming a first etching mask on said silicon oxide film, said first etching mask having first openings that define a pattern of first contact windows; performing an isotropic dry etching process to remove portions of said silicon oxide film exposed through said first openings in said first etching mask, thereby exposing the surface of said second insulating film; performing an anisotropic dry etching process to remove portions of said second insulating film exposed through said first openings in said first etching mask, thereby exposing the surface of said plurality of diffusion layers, and forming said first contact windows; removing said first etching mask; performing a glass flow process to make said silicon oxide film soften and flow; forming a plurality of third conductive layers on said silicon oxide film, to contact with said plurality of diffusion layers through said first contact windows; forming a third insulating film on said silicon oxide film, to cover said plurality of third conductive layers; forming a second etching mask on said third insulating film, said second etching mask having second openings that define a pattern of second contact windows; performing an anisotropic dry etching process to remove portions of said third insulating film exposed through said second openings in said second etching mask, to remove portions of said silicon oxide film and said second insulating film exposed through said second openings in said second etching mask, thereby exposing the surface of said plurality of diffusion layers and forming said second contact windows; removing said second etching mask; and forming a plurality of fourth conductive layers on said third insulating film, to contact with said plurality of diffusion layers through said second contact windows.

In a preferred embodiment, said step of forming said second insulating film comprises the steps of: forming a silicon oxide film over said semiconductor substrate; and forming a silicon nitride film on said silicon oxide film.

In a preferred embodiment, said step of forming said silicon oxide film comprises the step of forming a BPSG film on said second insulating film by a CVD technique.

In a preferred embodiment, said isotropic dry etching process is performed in a microwave plasma etching apparatus.

According to the invention, a method for fabricating a semiconductor integrated circuit device is provided, comprising the steps of: forming a plurality of first conductive layers on a semiconductor substrate, each of said plurality of first conductive layers being covered with a first insulating film; forming a plurality of diffusion layers in the surface regions of said semiconductor substrate, between said plurality of first conductive layers, each of said plurality of diffusion layers functioning as a second conductive layer; forming a second insulating film over said semiconductor substrate to cover said plurality of diffusion layers and said first insulating films; forming a silicon film on said second insulating film; forming a silicon oxide film on said silicon film, said silicon oxide film being doped with impurities; forming an etching mask on said silicon oxide film, said etching mask having openings that define a pattern of contact windows; performing an anisotropic dry etching process to remove portions of said silicon oxide film exposed through said openings in said etching mask, thereby exposing the surface of said silicon film; performing an isotropic dry etching process to remove portions of said silicon film exposed through said openings in said etching mask, thereby causing said silicon oxide film to overhang; performing an anisotropic dry etching process to remove portions of said second insulating film exposed through said openings in said etching mask, thereby exposing the surface of said plurality of diffusion layers, and forming said contact windows; removing said etching mask; and performing a glass flow process to make said silicon oxide film soften and flow, thereby making said silicon oxide film cover fully said silicon film.

In a preferred embodiment, said step of forming said silicon oxide film comprises the step of forming a BPSG film on said silicon film by a CVD technique.

In a preferred embodiment, said isotropic dry etching process is performed in a microwave plasma etching apparatus.

According to the invention, a method for fabricating a semiconductor integrated circuit device is provided, comprising the steps of: forming a plurality of first conductive layers on a semiconductor substrate, each of said plurality of first conductive layers being covered with a first insulating film; forming a plurality of diffusion layers in the surface regions of said semiconductor substrate, between said plurality of first conductive layers, each of said plurality of diffusion layers functioning as a second conductive layer; forming a second insulating film over said semiconductor substrate to cover said plurality of diffusion layers and said first insulating films; forming a silicon film on said second insulating film; forming a silicon oxide film on said silicon film, said silicon oxide film being doped with impurities; forming a first etching mask on said silicon oxide film, said first etching mask having first openings that define a pattern of first contact windows; performing an anisotropic dry etching process to remove portions of said silicon oxide film exposed through said first openings in said first etching mask, thereby exposing the surface of said silicon film; performing an isotropic dry etching process to remove portions of said silicon film exposed through said openings in said etching mask, thereby causing said silicon oxide film to overhang; performing an anisotropic dry etching process to remove portions of said second insulating film exposed through said first openings in said first etching mask, thereby exposing the surface of said plurality of diffusion layers, and forming said first contact windows; removing said first etching mask; performing a glass flow process to make said silicon oxide film soften and flow, thereby making said silicon oxide film cover fully said silicon film; forming a plurality of third conductive layers on said silicon oxide film, to contact with said plurality of diffusion layers through said first contact windows; forming a third insulating film on said silicon oxide film, to cover said plurality of third conductive layers; forming a second etching mask on said third insulating film, said second etching mask having second openings that define a pattern of second contact windows; performing an anisotropic dry etching process to remove portions of said third insulating film exposed through said second openings in said second etching mask, to remove portions of said silicon oxide film exposed through said second openings in said second etching mask, thereby exposing the surface of said silicon film; performing an isotropic dry etching process to remove portions of said silicon film exposed through said second openings in said second etching mask, thereby exposing the surface of said second insulating film; performing an anisotropic dry etching process to remove portions of said second insulating film exposed through said second openings in said second etching mask, thereby exposing the surface of said plurality of diffusion layers and forming said second contact windows; removing said second etching mask; and forming a fourth insulating film inside said second contact windows: forming a plurality of fourth conductive layers on said third insulating film, to contact with said plurality of diffusion layers through said second contact windows.

In a preferred embodiment, said step of forming said silicon oxide film comprises the step of forming a BPSG film on said second insulating film by a CVD technique.

In a preferred embodiment, said isotropic dry etching process is performed in a microwave plasma etching apparatus.

Thus, the present invention described herein makes possible the objective of providing a method for fabricating a semiconductor integrated circuit device which permits the self-aligned formation of a contact window, without causing shorts or breaks of wiring, through an insulating film covering transistor devices integrated in high density.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

EXAMPLE 1

Figure 1A:
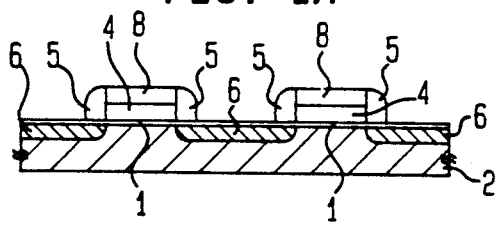
FIGS. 1A, 1B, 1C, 1D, and 1E are cross sectional views showing a portion of a semiconductor device at major processing steps according to a first embodiment of the present invention.

Referring to FIGS. 1A to 1E, we will describe a method for fabricating a DRAM according to one embodiment of the present invention. First, as shown in FIG. 1A, after forming a field insulating film (not shown) in an isolation region of a semiconductor substrate 2, MOSFETs were formed in device regions of the semiconductor substrate 2. FIG. 1A shows only two MOSFETs for simplicity, but in actual fact, numerous MOSFETs can be integrated on the same semiconductor substrate 2.

Each MOSFET consisted of: source/drain regions 6 each formed by a diffusion layer (second conductive layer) formed in the semiconductor substrate 2; a gate insulating film 1 (16 nm thickness) formed on the semiconductor substrate 2; and a gate electrode 4 (first conductive layer) formed above the channel region between the source/drain regions 6. The gate electrode 4 (250 nm thickness) was covered with a first insulating film (250 nm thickness) consisting of side wall spacers 5 and an upper insulating film 8 both of which were formed from an HTO (high temperature oxide) film (a first HTO film).

The gate electrodes 4 of the two respective MOSFETs were spaced apart about 0.9 μm from each other. The source/drain region 6 formed in an area flanked by the two gate electrodes 4 was shared by the two MOSFETs. In this specification, the source region and the drain region are not specifically distinguished from each other, but these are collectively referred to as the "source/drain region" for simplicity.

The diffusion layers forming the source/drain regions 6 were formed in self-aligning fashion with respect to the gate electrodes 4, after the step of forming the gate electrodes 4, by ion implantation using the gate electrodes 4 and the side wall spacers 5 as an implant mask.

Figure 1B:
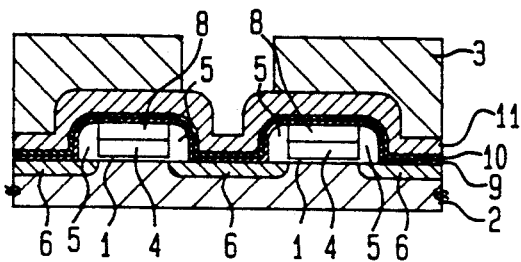

Next, as shown in FIG. 1B, a second HTO film 9 (50 nm thickness) and a silicon nitride film 10 (20 nm thickness) were deposited by a low-pressure chemical vapor deposition (LPCVD) technique, one on top of the other on the semiconductor substrate 2, thus covering the MOSFETs. The second HTO film 9 and the silicon nitride film 10 together constituted a second insulating film having a two-layer structure. The second insulating film acted as an etch stop layer. Next, after depositing a BPSG film 11 on the silicon nitride film 10 by an atmospheric pressure CVD (APCVD) technique, a resist 3 having an opening that defines the pattern of a contact window was formed on the BPSG film 11 by photolithography. The opening (first opening) in the resist 3 had a size larger than the spacing between the MOSFETs. With the self-aligned contact technique, a contact can be formed between the MOSFETs even if the opening in the resist 3 is larger than the spacing between the MOSFETs.

Figure 1C:
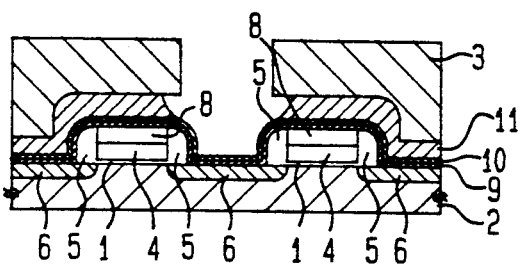

As shown in FIG. 1C, using the resist 3 as an etching mask, isotropic dry etching was performed to etch the portion of the BPSG film 11 exposed through the opening in the resist 3, thereby exposing the surface of the underlying silicon nitride film 10.

Figure 2:
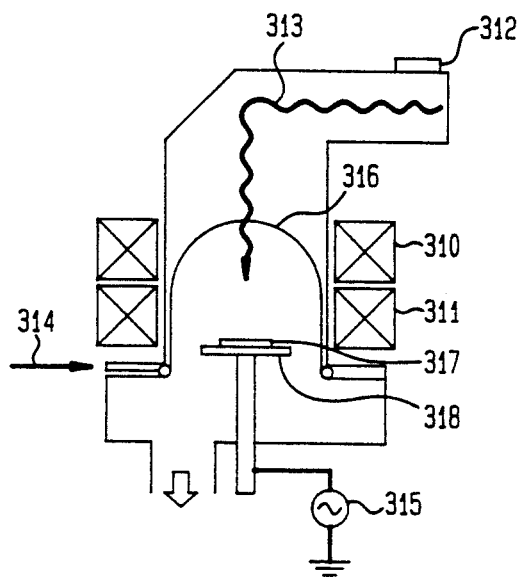
FIG. 2 is a diagram showing the construction of a microwave plasma etching apparatus used in the first embodiment.

In this embodiment, the isotropic dry etching of the BPSG film 11 was performed using a microwave plasma etching apparatus. FIG. 2 shows the construction of the apparatus. As shown in FIG. 2, an electrode 318 is disposed in a quartz bell jar 316 evacuated to a high vacuum. The electrode 318 is connected to a high-frequency power supply 315 of 13.56 MHz. An etching gas is introduced into the quartz bell jar 316 through a gas inlet 314. A microwave 313 of 2.45 gigahertz emitted from a magnetron 312 is directed through a waveguide onto the etching gas introduced into the quartz bell jar 316. Solenoid coils 310, 311 provided around the quartz bell jar 316 are energized to form in the bell jar 316 a 875-gauss magnetic field at right angles to the traveling direction of the microwave 313. The presence of the microwave 313 in the magnetic field generates an electron cyclotron resonance (ECR), and a high-density plasma of etching gas is produced within the quartz bell jar 316. The energy of ions radiated from the plasma onto a wafer 317 on the electrode 318 can be controlled by adjusting the magnitude of the high-frequency bias applied to the electrode 318. In this embodiment, the isotropic dry etching was performed using an $SF_6$ gas (flow rate: 50 sccm) at a gas pressure of 13 Pa, microwave power of 220 mW, and high-frequency bias (RF bias) of 0 W.

With the prior art anisotropic dry etching technique, the etching rate of the BPSG film 11 cannot be made sufficiently greater than the etching rates of the silicon nitride film 10 and the second HTO film 9. In this embodiment, if anisotropic dry etching is used instead of isotropic dry etching, since the underlying silicon nitride film 10 and the second HTO film 9 cannot serve as an etch stop layer during the etching of the BPSG film 11, these layers will also be etched and the gate electrodes 4 will very likely be exposed. On the other hand, the isotropic dry etching technique of this embodiment has the advantage that an undoped silicon oxide film or silicon nitride film can be used as an etch stop layer during the etching of a heavily doped silicon oxide film (BPSG film 11).

Figure 1D:
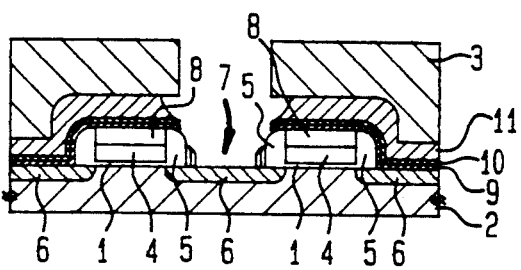

Next, as shown in FIG. 1D, using the resist 3 as an etching mask, anisotropic dry etching was performed to etch away the exposed portions of the silicon nitride film 10 and the second HTO film 9. As a result of this etching, the surface of the source/drain region 6 shared by the two MOSFETs was exposed, thus completing the formation of a contact window 7. During the process of etching the silicon nitride film 10 and the second HTO film 9, the side wall spacer 5 and the upper insulating film 8 both having a greater thickness than the above films remain almost unetched. If the etching process is continued for an extended duration of time after the surface of the source/drain region 6 was exposed, pin-holes may be opened in the relatively thick side wall spacer 5 and upper insulating film 8, resulting in the exposure of the surfaces of the gate electrodes 4. To avoid such a possibility, the etching can be stopped after the endpoint detector attached to the etching apparatus had detected the exposed surface of the source/drain region 6 constituted by silicon. However, if any portion of the second HTO film 9 is left on the surface of the source/drain region 6, a contact failure will occur. To avoid this, the etching is not stopped upon detection of the exposed surface of the source/drain region 6, but continued for a prescribed time after that. This extra etching is also practiced in prior art methods of opening contact windows and is generally called "over-etching".

After removing the resist 3, in order to improve the flatness of the surface of the BPSG film 11, a heat treatment process (glass flow process) was performed for 60 minutes in a nitrogen gas at 900° C. to make the BPSG film 11 soften and flow. Anisotropic etching was performed again, to remove the thin oxide film grown on the exposed surface of the source/drain region 6 as a result of the glass flow process.

Figure 1E:
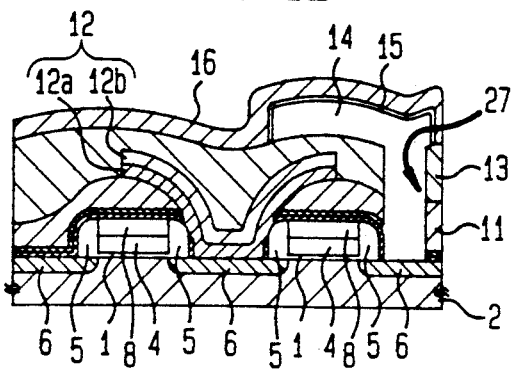

Next, after forming a polycrystalline silicon film 12a and a titanium silicide film 12b one on top of the other on the BPSG film 11, a bit line pattern was produced in these films 12a and 12b to form a polycide bit line 12 (third conductive layer) FIG. 1E). Further, after forming another BPSG film 13 on the BPSG film 11 in such a way as to cover the polycide bit line 12, a contact window 27, a storage node 14 (fourth conductive layer), a capacitive insulating film 15, and a plate electrode 16 were successively formed by a conventional method, thus completing the fabrication of a DRAM on which the MOSFETs shown in FIG. 1E were integrated in numerous numbers.

The contact window 7 thus formed had an inner diameter increasing toward its upper end, as shown in FIG. 1D. The inner diameter (1.6 μm) at the upper end of the contact window 7 was greater than the spacing between MOSFETs (spacing between gate electrodes: 0.9 μm), but the inner diameter at its lower end was about 0.4 μm, which was smaller than the spacing between the gate electrodes 4. Such a construction of the contact window 7 made it easier to bury conductive materials therein and was therefore suitable for forming a contact with less possibility of connection failure between the interconnecting line (polycide bit line 12) and the source/drain region 6. Such construction is desirable for contact windows in semiconductor devices having numerous MOSFETs integrated in high density on the same semiconductor substrate.

In this embodiment, the BPSG film 11 was used as a layer underlying the polycide bit line 12, and the glass flow process of the BPSG film 11 was performed prior to the process for forming the polycide bit line 12. As a result, the steps (irregularities) formed on the surface of the BPSG film 11 because of the presence of the gate electrodes 4 were reduced, thereby preventing the breakage and shorting of the polycide bit line 12 formed on the BPSG film 11.

Figure 3:
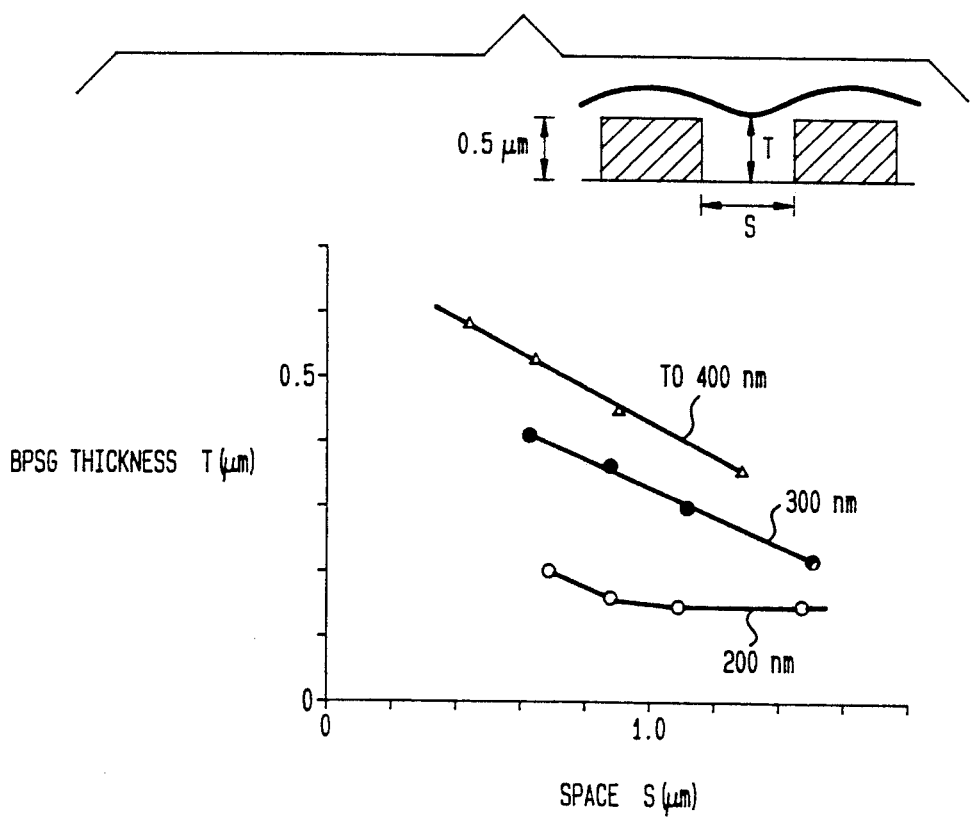
FIG. 3 is a graph showing the relationship between the thickness of a BPSG film immediately after deposition and the thickness thereof after flow.

Referring to FIG. 3, we will describe in detail the advantages provided by etching the BPSG film by an isotropic dry etching. FIG. 3 shows the relationship of the spacing S between two gate electrodes (0.5 μm thickness) with respect to the thickness T of the BPSG film positioned between the gate electrodes. The thickness T represents the thickness after the glass flow process (900° C., 60 minutes). When the spacing S was sufficiently great as compared with the thickness T, the thickness T was close to the thickness $T_0$ of the BPSG film before the glass flow process (the thickness $T_0$ is the thickness of the BPSG film immediately after deposition). As the spacing S was reduced, the thickness T increases, and the flatness of the BPSG film was improved. On the other hand, as the thickness of the BPSG film before the flow process reduced, the thickness T after the glass flow process also reduced, and the flatness of the BPSG film was thus impaired. Therefore, in order to improve the flatness of the BPSG film after the glass flow process, it is necessary to secure a sufficient amount of the BPSG film on the gate electrodes before the glass flow process. However, if isotropic wet etching was used for the etching process of the BPSG film 11 shown in FIG. 1C, the amount of the BPSG film 11 deposited on the gate electrodes 4 was reduced because of etching in lateral directions. A reduction in the amount of the BPSG film 11 deposited on the gate electrodes 4 results in an impaired flatness of the BPSG film 11 between the gate electrodes 4 after the glass flow process.

Figure 4:
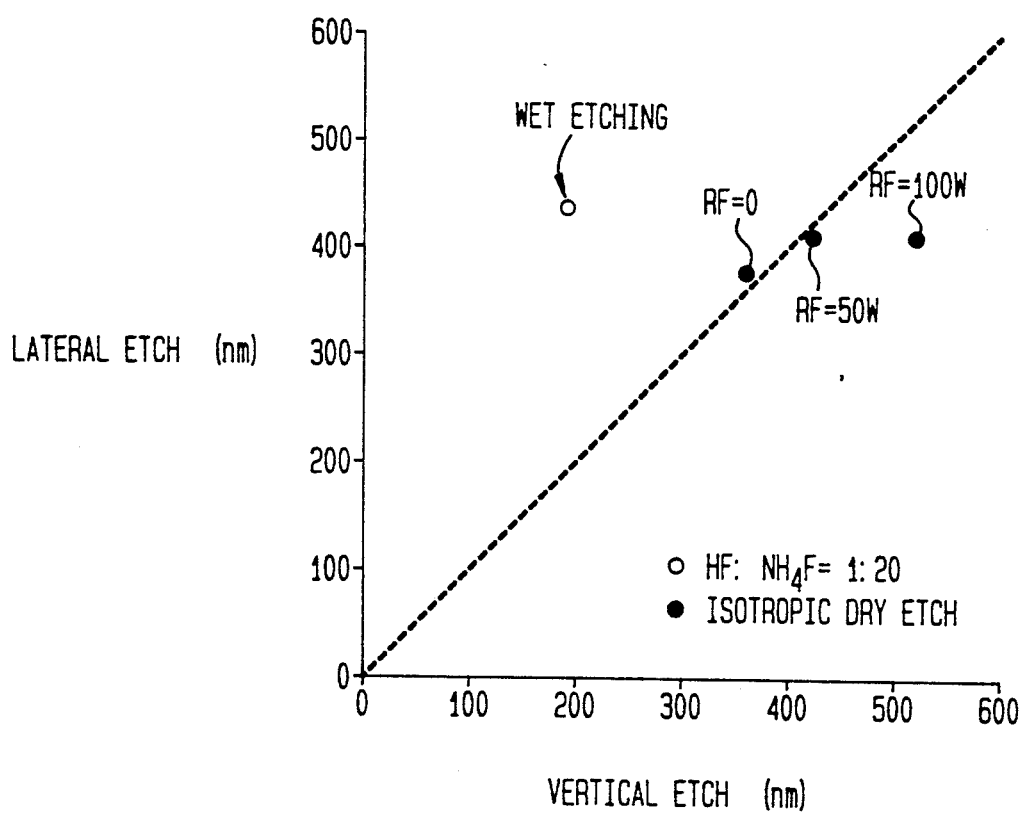
FIG. 4 is a graph showing the relationship between the etching rates of the BPSG film in lateral and vertical directions.

FIG. 4 shows the ratio of the lateral etching rate to the vertical etching rate when the BPSG film 11 was etched isotropically, by using as a mask a resist formed on the BPSG film 11 and having an opening of 1 $\mu$m inner diameter. According to the prior art wet etching technique using a mixture of HF and $NH_4F$ ($HF:NH_4F = 1:20$), the lateral etching rate was 2.3 times greater than the vertical etching rate. On the other hand, according to the isotropic dry etching technique employed in this embodiment, the lateral etching rate was reduced to about the same level as the vertical etching rate or to a lower level than that, and by raising the high-frequency bias (RF bias), the vertical etching rate can be increased while holding the lateral etching rate at a constant level. According to this isotropic dry etching technique, since the contact window 7 can be opened in the BPSG film 11 without deeply etching the BPSG film 11 in lateral directions, the recessed portion in the BPSG film 11 between the gate electrodes 4 around the contact window 7 was sufficiently filled after the glass flow process of the bpsg film 11, thus reducing the surface steps.

It will be appreciated that the isotropic dry etching herein stated does not necessarily refer to the etching in which the lateral etching rate is precisely equal to the vertical etching rate, but is also refers to the dry etching in which the vertical etching rate is greater than the lateral etching rate as shown in FIG. 4. On the other hand, anisotropic dry etching means dry etching in which virtually no lateral etching is carried out.

Figure 5A:
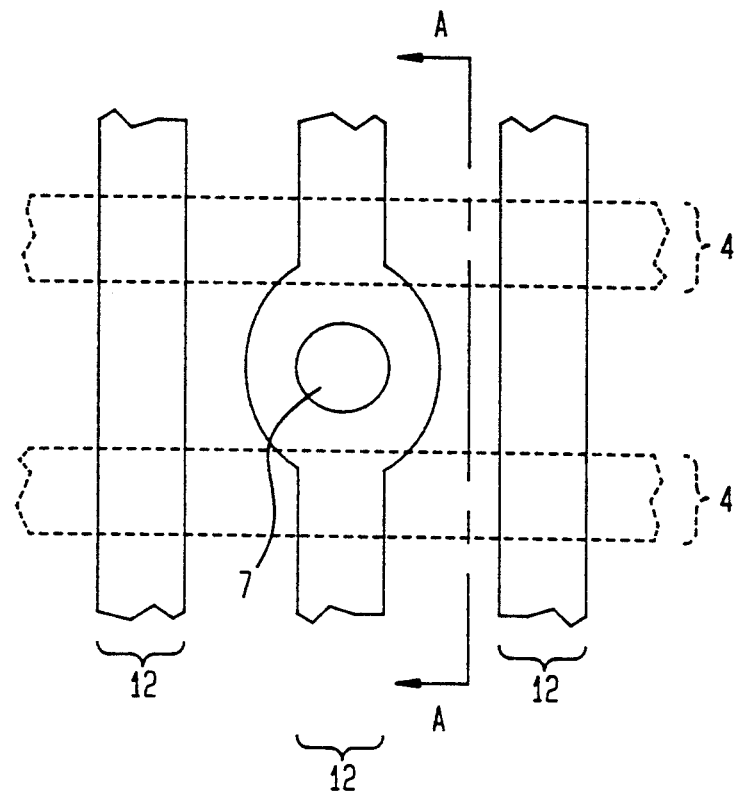
FIG. 5A is a diagram showing a bit line formed according to the first embodiment.
Figure 5B:
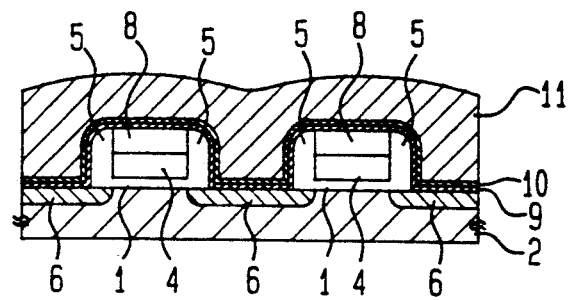
FIG. 5B is a cross sectional view taken along line A—A in FIG. 5A.

FIG. 5A is a plan view showing a portion of the DRAM immediately after the formation of polycide bit lines 12. FIG. 5B shows a cross section taken along line A—A in FIG. 5A. Since the BPSG film 11 between the gate electrodes 4 was sufficiently flattened as shown in FIG. 5B, shorting between the polycide bit lines 12 was prevented as shown in FIG. 5A.

With a conventional anisotropic dry etching technique, it is possible to open a deep contact window in a vertical direction while completely holding back lateral etching, but on the other hand, the silicon nitride film 10 and silicon oxide layers such as the second HTO film 9 underlying the BPSG film 11 will also be etched at a high etching rate. This is because, with anisotropic dry etching, it is difficult to selectively etch the BPSG film 11 without affecting the silicon nitride film 10 and the second HTO film 9. Therefore, in etching the BPSG film 11 using a conventional anisotropic dry etching technique, it is necessary to provide a polycrystalline silicon film (more resistive to etching than silicon oxide films) as an underlying layer (etch stop layer), as is the case with the second prior art, but according to the isotropic dry etching of this embodiment, there was no such need. Accordingly, the method of this embodiment was free from the drawbacks associated with the second prior art.

Figure 6A:
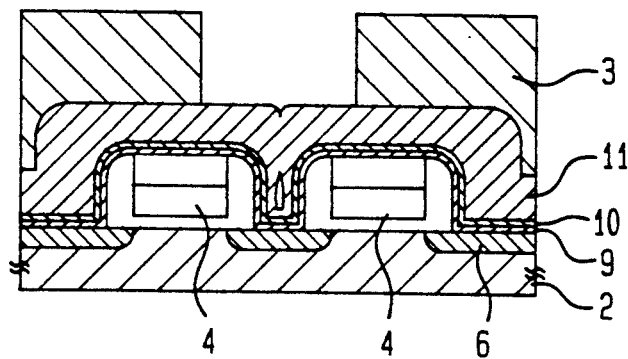
FIGS. 6A, 6B, and 6C are cross sectional views showing the geometry of the BPSG film etched by isotropic dry etching when the spacing between gate electrodes is reduced.
Figure 6B:
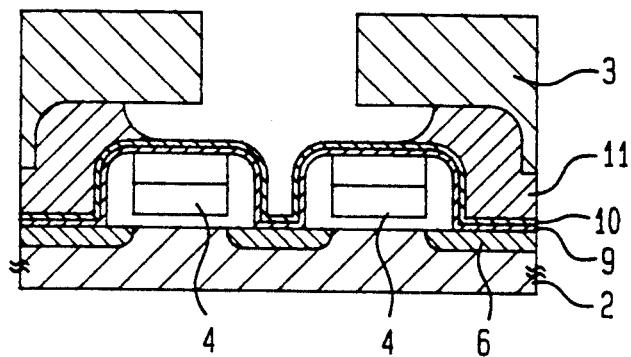
Figure 6C:
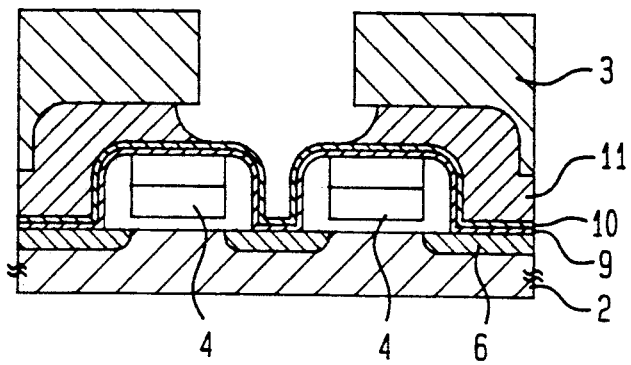

FIGS. 6A to 6C are cross sectional views diagrammatically showing a portion of a DRAM with the spacing between the gate electrodes 4 reduced as compared with that of the above embodiment. In the DRAM shown in FIG. 6A, the spacing between the gate electrodes 4 is about 0.6 $\mu$m. When the spacing between the gate electrodes 4 is reduced to a dimension smaller than approximately 0.6 $\mu$m, the thickness of the BPSG film 11 positioned between the gate electrodes 4 greatly increases as compared with that of the BPSG film 11 deposited on other wider regions. When this thick portion of the BPSG film 11 is etched by isotropic dry etching (with conditions of RF=0 W) until the source/drain regions 6 were exposed, an opening having an inner diameter enlarged as shown in FIG. 6B is formed in the BPSG film 11. On the other hand, when isotropic dry etching is performed with such conditions as to reduce the lateral etching rate as compared with the vertical etching rate (for example, at RF=50 W), an opening having an inner diameter not enlarged more than necessary can be formed in the BPSG film 11, as shown in FIG. 6C. With the isotropic dry etching technique using such conditions, since the BPSG film 11 above the gate electrodes 4 is not etched excessively in lateral directions, the surface flatness of the BPSG film 11 can be achieved after the glass flow process.

Figure 7A:
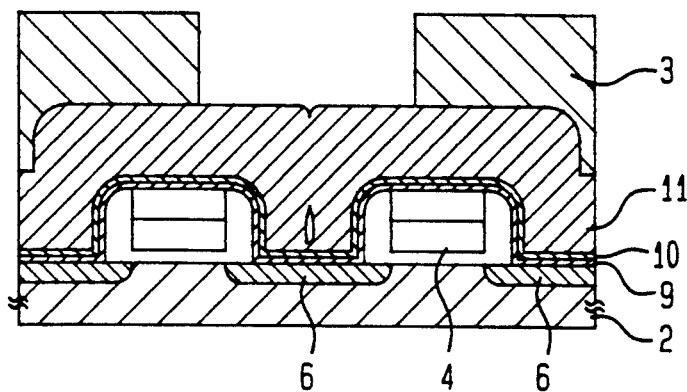
FIGS. 7A, 7B, and 7C are cross sectional views showing the geometry of the BPSG film etched by isotropic dry etching when the BPSG film is thick.
Figure 7B:
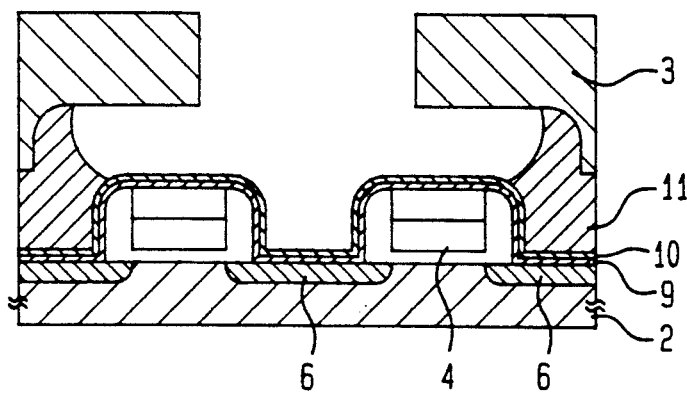
Figure 7C:
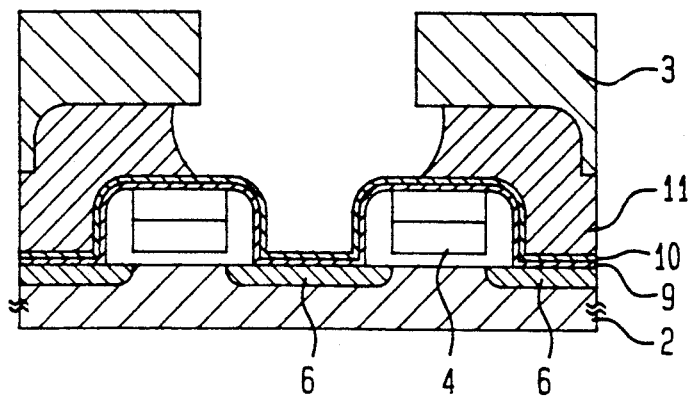

Even when the spacing between the gate electrodes 4 is not reduced, if the thickness of the BPSG film 11 is approximately equal to or greater than the spacing between the gate electrodes 4, the thickness of the BPSG film 11 positioned between the gate electrodes 4 greatly increases, as shown in FIG. 7A, as compared to the thickness of the BPSG film 11 deposited on other wider regions. In this case also, when this thick portion of the BPSG film 11 is etched by isotropic dry etching (with conditions of RF=0W) until the source/drain regions 6 were exposed, an opening having an inner diameter enlarged as shown in FIG. 7B is formed in the BPSG film 11. On the other hand, when isotropic dry etching is performed with such conditions as to reduce the lateral etching rate as compared with the vertical etching rate (for example, at RF=50W), an opening having an inner diameter not enlarged more than necessary can be formed in the BPSG film 11, as shown in FIG. 7C.

Thus, according to the isotropic dry etching technique in this invention, the lateral etching of the BPSG film 11 can be properly controlled by adjusting the magnitude of the high frequency bias applied to the electrode of the etching apparatus, even when the etching is performed until the BPSG film 11 completely filling the space between the gate electrodes 4 is etched to expose the underlying layer. On the other hand, with anisotropic dry etching, since the lateral etching rate of the BPSG film 11 cannot be controlled to a proper value, the coverage of the line material (conductive material) deposited on the BPSG film 11 may deteriorate inside the contact window, causing breaks in the wiring.

In this embodiment, the BPSG film 11 was used, but it will be appreciated that the same effects as the BPSG film 11 can be obtained by any silicon oxide film, such as PSG (Phosphosilicate glass) film, as long as it is doped with impurities and is capable of flowing.

EXAMPLE 2

Figure 8A:
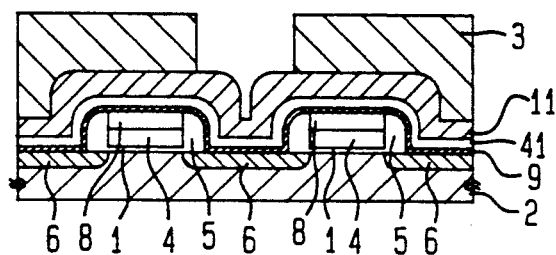
FIGS. 8A, 8B, 8C, 8D, 8E, and 8F are cross sectional views showing a portion of a semiconductor device at major processing steps according to another method for the present invention.

Referring to FIGS. 8A to 8E, we will now describe a method for fabricating a DRAM according to another embodiment of the present invention. First, as shown in FIG. 8A, after forming a field insulating film (not shown) in an isolation region of a semiconductor substrate 2, MOSFETs were formed in a device region of the semiconductor substrate 2 by a conventional method. Each MOSFET consisted of: source/drain regions 6 each formed by a diffusion layer (second conductive layer) formed in the semiconductor substrate 2; a gate insulating film 1 (16 nm thickness) formed on the semiconductor substrate 2; and a gate electrode 4 (first conductive layer) formed above the channel region between the source/drain regions 6. The gate electrode 4 was covered with a first insulating film (250 nm thickness) consisting of side wall spacers 5 and an upper insulating film 8, both of which were formed from an HTO film (a first HTO film). The gate electrodes 4 (each 250 nm thickness) of the two respective MOSFETs were spaced apart about 0.9 μm from each other. The source/drain region 6 formed in an area flanked by the two gate electrodes 4 was shared by the two MOSFETs.

Next, as shown in FIG. 8A, a second HTO film 9 (50 nm thickness) and a polycrystalline silicon film 41 (50 nm thickness) were deposited by a LPCVD technique, one on top of the other on the semiconductor substrate 2, thus covering the MOSFETs. The polycrystalline silicon film 41 acted as an etch stop layer during the anisotropic dry etching of a BPSG film 11. Next, after the BPSG film 11 (400 nm thickness) was deposited on the polycrystalline silicon film 41 by atmospheric pressure CVD, a resist 3 having a first opening that defines the pattern of a contact window 7 was formed on the BPSG film 11 by photolithography.

Figure 8B:
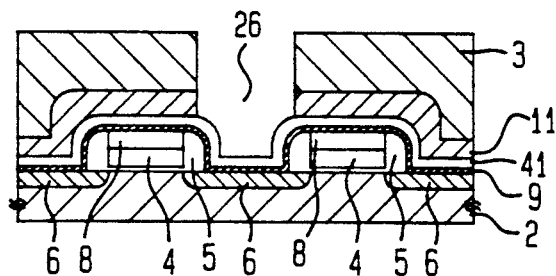

As shown in FIG. 8B, using the resist 3 as an etching mask, anisotropic dry etching was performed to etch the portion of the BPSG film 11 exposed through the first opening in the resist 3, to expose the surface of the underlying polycrystalline silicon film 41. Since the etching rate of the BPSG film 11 was sufficiently greater than the etching rate of the polycrystalline silicon film 41, the second insulating film sufficiently served as an etch stop layer against anisotropic dry etching. Therefore, even when over-etching is performed for a long duration of time to ensure elimination of residual substances when etching the BPSG film 11, the presence of the polycrystalline silicon film 41 having a sufficient thickness effectively serves to prevent the exposure of the gate electrodes 4. Since the polycrystalline silicon film 41 according to the embodiment does not require oxidation processing for insulation, the thickness thereof can be set at approximately 30 nm or greater. Since the presence of the thick polycrystalline silicon film 41 permits a sufficient degree of over-etching, etching with a high degree of anisotropy can be performed on the BPSG film 11 even if the BPSG film 11 has a thickness over 400 nm.

Figure 8C:
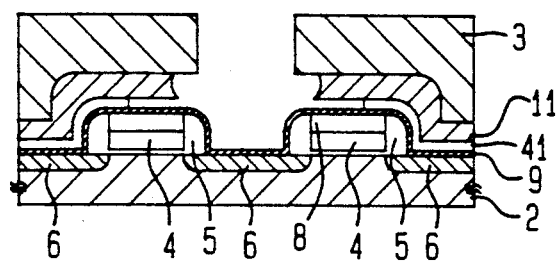

Next, as shown in FIG. 8C, using the resist 3 as an etching mask, isotropic dry etching was performed to etch away the exposed portions of the polycrystalline silicon film 41 as well as the portions of the BPSG film 11 that were left inside the contact window, thus exposing the surface of the second HTO film 9. The etching was carried out using the same conditions as for the isotropic dry etching performed in the foregoing embodiment. During the above etching, since the etching rate of the HTO film was sufficiently smaller than the etching rate of the polycrystalline silicon film 41 and the BPSG film 11, the second HTO film 9 served as an etch stop layer.

To describe in more detail, in the above isotropic dry etching, the BPSG film 11 etches at a rate of about 80 nm/min., which was slower than the etching rate of the polycrystalline silicon film 41 (about 500 nm/min.). Also, since the side faces of the BPSG film 11 positioned inside the contact window 7 were covered with a side wall protective film of organic material during the above anisotropic dry etching process, those side faces were further resistive to lateral etching. Therefore, when the above isotropic dry etching was performed, the polycrystalline silicon film 41 above the gate electrodes 4 was etched deeper in lateral directions than the BPSG film 11, as shown in FIG. 8C, causing the BPSG film 11 to overhang. Under the conditions employed for this embodiment, the polycrystalline silicon film 41 was etched in lateral directions about 200 nm deeper than the BPSG film 11.

Figure 8D:
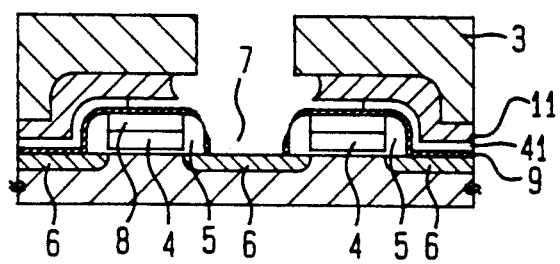

Next, as shown in FIG. 8D, using the resist 3 as an etching mask, anisotropic dry etching was performed to etch the second HTO film 9. As a result of this etching, the surface of the source/drain region 6 shared by the two MOSFETs was exposed, thus completing the formation of the contact window 7. In the process of etching the second HTO film 9, the side wall spacer 5 and the upper insulating film 8 having a greater thickness than the second HTO film 9 remain almost unetched.

After removing the resist 3, glass flow process was performed for 60 minutes in nitrogen at 900° C. to make the BPSG film 11 flow and thereby improve the surface flatness of the BPSG film 11. During the glass flow process, the exposed portions of the polycrystalline silicon film 41 above the gate electrodes 4 were completely covered with the overhanging portions of the BPSG film 11. The polycrystalline silicon film 41 of this embodiment thus becomes completely isolated from other conductive layers by the BPSG film 11. Therefore, according to this embodiment, there was no need to completely transform the polycrystalline silicon film 41 into a silicon oxide film (an insulating film) using a method for oxidizing the polycrystalline silicon film 41.

Figure 8E:
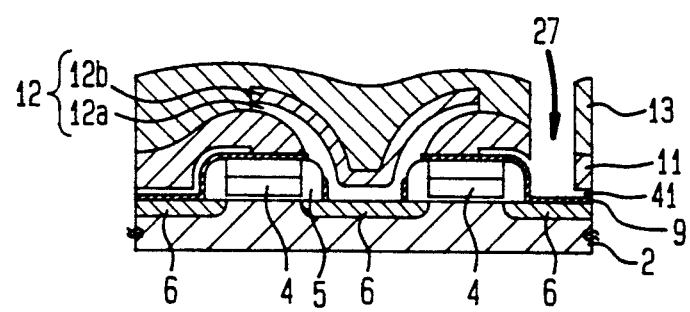
Figure 8F:
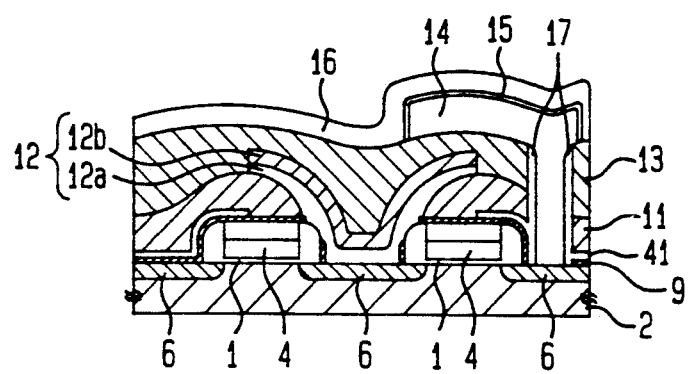
Figure 9A:
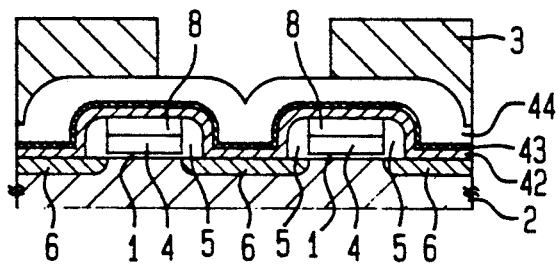
FIGS. 9A, 9B, 9C, and 9D are cross sectional views showing a portion of a semiconductor device at major processing steps according to a prior art method.
Figure 9B:
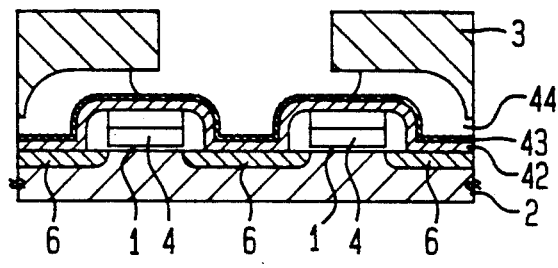
Figure 9C:
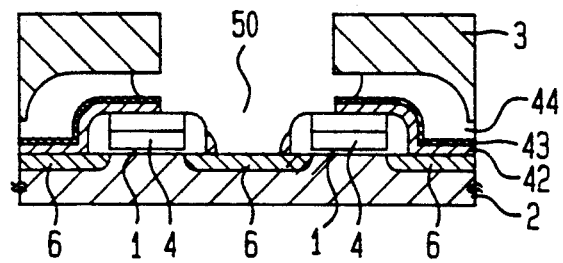
Figure 9D:
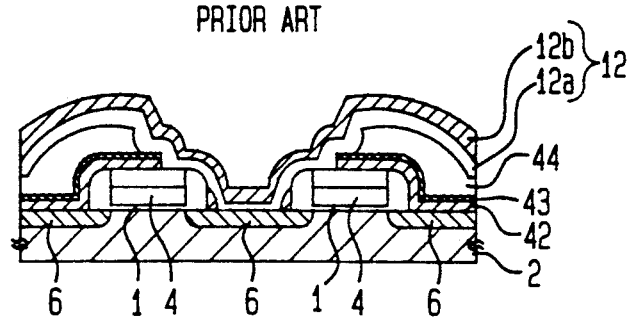
Figure 10A:
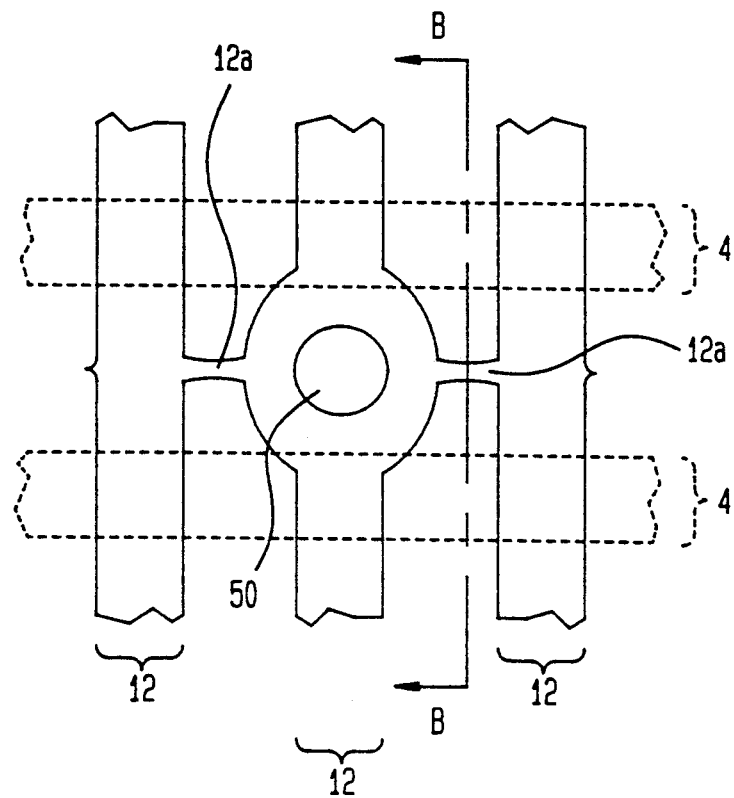
FIG. 10A is a plan view showing a bit line formed according to the prior art.
Figure 10B:
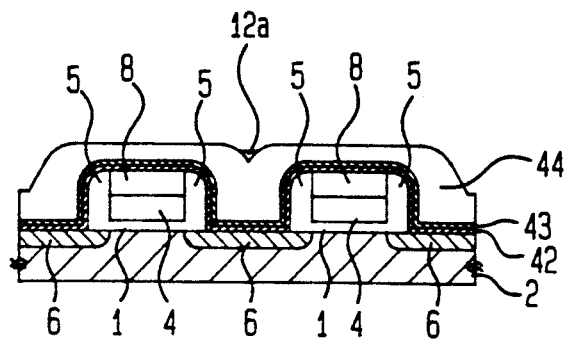
FIG. 10B is a cross sectional view taken along line B—B in FIG. 10A.
Figure 11A:
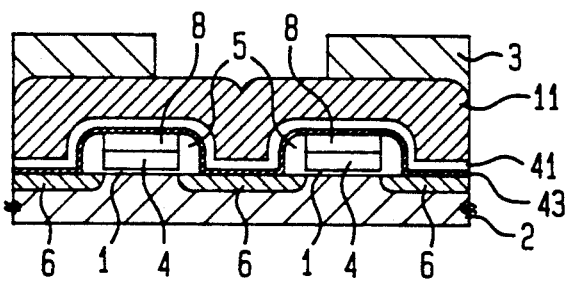
FIGS. 11A, 11B, 11C, and 11D are cross sectional views showing a portion of a semiconductor device at major processing steps according to another prior art method.
Figure 11B:
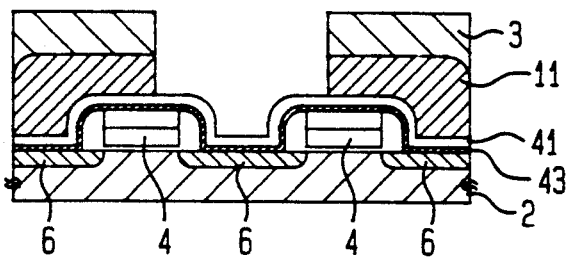
Figure 11C:
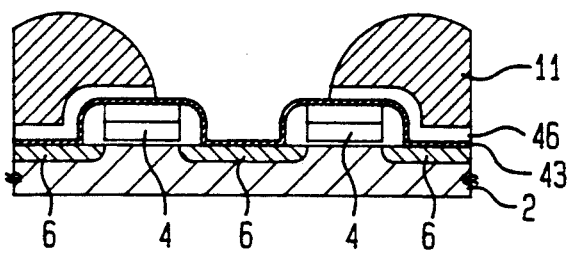
Figure 11D:
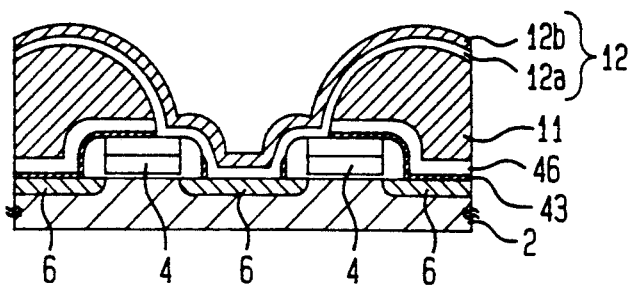
Figure 12A:
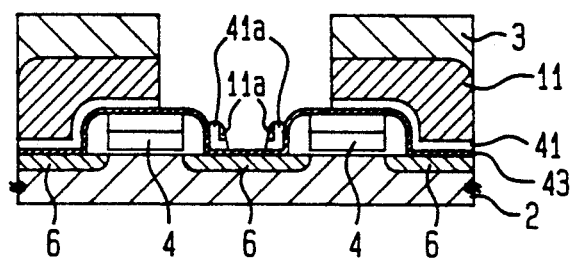
FIGS. 12A, 12B, 12C and FIGS. 13A to 13B are diagrams to explain the problems associated with the prior art method.
Figure 12B:
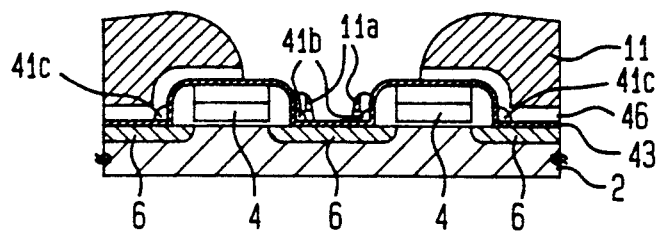
Figure 12C:
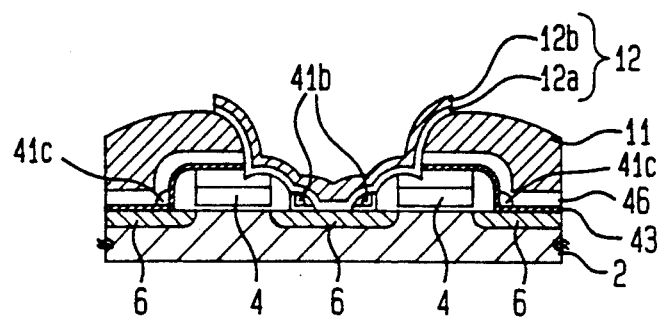
Figure 13A:
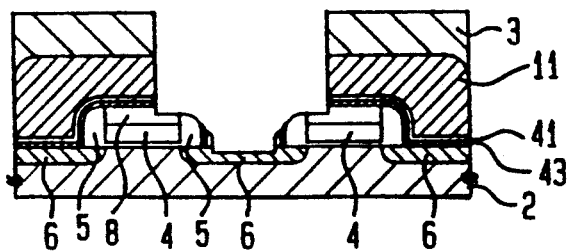
Figure 13B:
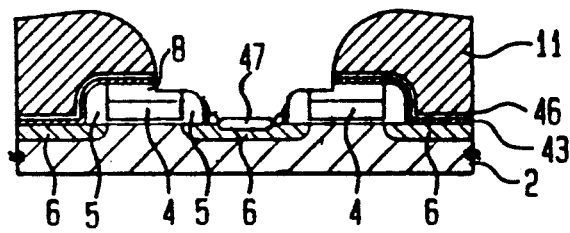
Figure 13C:
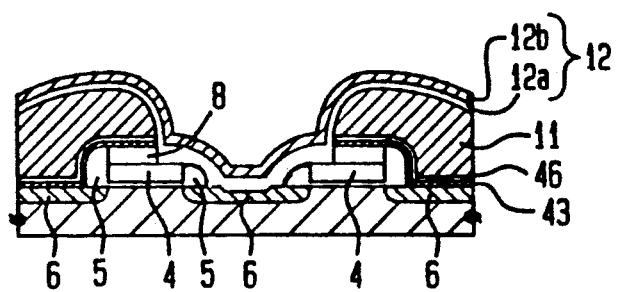

An anisotropic etching was performed again, to remove the oxide film grown on the exposed surface of the source/drain region 6 as a result of the flow process. Next, after forming a polycrystalline silicon film 12a and a titanium silicide film 12b one on top of the other on the BPSG film 11, a bit line pattern was produced in these films 12a and 12b to form a polycide bit line 12 (third conductive layer) (FIG. 8E). Further, another BPSG film 13 (second BPSG film) was formed on the BPSG film 11 in such a way as to cover the polycide bit line 12.

Thereafter, in order to provide an electrical contact between a storage node 14 (fourth conductive layer to act as an electrode of a memory cell capacitor) and the source/drain region 6, a contact window 27 shown in FIG. 8E was formed in an approximately similar manner to the previously described manner of forming the contact window 7. During the etching of the BPSG film 11 and the second BPSG film 13 performed to open the contact window 27, the polycrystalline silicon film 41 serves as an etch stop layer. According to the prior art method that requires oxidation of the polycrystalline silicon film 41, since the polycrystalline silicon film 41 was already transformed into a silicon oxide film at the stage of forming the contact window 27, it was not possible to etch the thick BPSG films 11 and 13 by using the polycrystalline silicon film 41 as an etch stop layer. Thus, according to this embodiment, the contact window 27 for connecting the storage node 14 to the source/drain region 6 can be formed in self-aligning fashion as in the case of forming the contact window 7 for connecting the bit line 12 to the source/drain region 6.

The process of forming the contact window 27 proceeds in a similar manner to the forming of the contact window 7; after removing the polycrystalline silicon film 41 from inside the contact window 27, isotropic dry etching was performed to laterally etch the polycrystalline silicon film 41 on the gate electrode 4, causing the BPSG film 11 to overhang as shown in FIG. 8E. However, the above process was not followed by the process to make the BPSG film 11 flow. Therefore, without any further processing, the polycrystalline silicon film 41 would not be completely covered with the BPSG film 11 inside the contact window 27, causing the storage node 14 to contact the polycrystalline silicon film 41. This would cause the storage node 14 to short to storage nodes (not shown) of other memory cells via the polycrystalline silicon film 41. To prevent this, a side wall spacer 17 made of an HTO film was formed on the inside wall of the contact window 27. After that, the storage node 14, a capacitive insulating film 15, and a plate electrode 16 were successively formed using a conventional technique.

Thus, according to this embodiment, since the polycrystalline silicon film 41, not a silicon oxide film, was used as an etch stop layer during the etching of the BPSG film 11, the BPSG film 11 could be etched by an anisotropic dry etching. This enabled the formation of the contact windows 7 and 27 each having a small inner diameter and a great depth. Also, in this embodiment, the BPSG film 11 was made to flow so as to completely cover the polycrystalline silicon film 41, eliminating the need for an oxidation process for completely transforming the polycrystalline silicon film 41 into an insulating film. This enabled the polycrystalline silicon film 41 to be made sufficiently thick, allowing over-etching to be performed for sufficient duration of time when etching the BPSG film. Sufficient over-etching serves to prevent defective formation of the contact windows resulting from unetched portions of the BPSG film 11.

As described above, according to the present invention, contact windows which do not cause shorts or breaks of interconnecting lines can be formed in self-aligning fashion in an insulating film covering the transistor devices integrated in high density.

In either of the above embodiments, the description has dealt with a method for forming a self-aligned contact between MOSFETs in a DRAM, but it will be appreciated that the present invention is also applicable to the fabrication of other semiconductor integrated circuit devices (such as devices consisting of bipolar transistors). Also, the isotropic dry etching can also be performed using dry etching apparatus other than the microwave plasma etching apparatus.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A method for fabricating a semiconductor integrated circuit device including a semiconductor substrate having surface regions, a plurality of first conductive layers, each of said first conductive layers covered with a first insulating film forming a plurality of first insulating films, and a plurality of diffusion layers in the surface regions of said semiconductor substrate between said first conductive layers, each of said diffusion layers functioning as a second conductive layer, comprising the steps of:

forming a second insulating film over said semiconductor substrate to cover said plurality of diffusion layers and said first insulating films;

forming a silicon oxide film on said second insulating film, said silicon oxide film being doped with impurities;

forming a first etching mask on said silicon oxide film, said first etching mask having first openings that define a pattern of first contact windows;

performing an isotropic dry etching process to remove portions of said silicon oxide film exposed through said first openings in said first etching mask, thereby exposing the surface of said second insulating film;

performing an anisotropic dry etching process to remove portions of said second insulating film exposed through said first openings in said first etching mask, thereby exposing the surface of said plurality of diffusion layers, and forming said first contact windows;

removing said first etching mask;

performing a glass flow process to make said silicon oxide film soften and flow;

forming a plurality of third conductive layers on said silicon oxide film, to contact with said plurality of diffusion layers through said first contact windows;

forming a third insulating film on said silicon oxide film, to cover said plurality of third conductive layers;

forming a second etching mask on said third insulating film, said second etching mask having second openings that define a pattern of second contact windows;

performing an anisotropic dry etching process to remove portions of said third insulating film exposed through said second openings in said second etching mask, to remove portions of said silicon oxide film and said second insulating film exposed through said second openings in said second etching mask, thereby exposing the surface of said plurality of diffusion layers and forming said second contact windows;

removing said second etching mask; and forming a plurality of fourth conductive layers on said third insulating film, to contact with said plurality of diffusion layers through said second contact windows.

2. A method according to claim 1, wherein said step of forming said second insulating film comprises the steps of:

forming a base silicon oxide film over said semiconductor substrate; and forming a silicon nitride film on said base silicon oxide film.

3. A method according to claim 1, wherein said step of forming said silicon oxide film comprises the step of forming a BPSG film on said second insulating film by a CVD technique.

4. A method according to claim 1, wherein said isotropic dry etching process is performed in a microwave plasma etching apparatus.

5. A method for fabricating a semiconductor integrated circuit device including a semiconductor substrate having surface regions, a plurality of first conductive layers, each of said first conductive layers covered with a first insulating film forming a plurality of first insulating films, and a plurality of diffusion layers in the surface regions of said semiconductor substrate between said first conductive layers, each of said diffusion layers functioning as a second conductive layer, comprising the steps of:

forming a second insulating film over said semiconductor substrate to cover said plurality of diffusion layers and said first insulating films;

forming a silicon film on said second insulating film;

forming a silicon oxide film on said silicon film, said silicon oxide film being doped with impurities;

forming an etching mask on said silicon oxide film, said etching mask having openings that define a pattern of contact windows;

performing an anisotropic dry etching process to remove portions of said silicon oxide film exposed through said openings in said etching mask, thereby exposing the surface of said silicon film;

performing an isotropic dry etching process to remove portions of said silicon film exposed through said openings in said etching mask, thereby causing said silicon oxide film to overhang;

performing an anisotropic dry etching process to remove portions of said second insulating film exposed through said openings in said etching mask, thereby exposing the surface of said plurality of diffusion layers, and forming said contact windows;

removing said etching mask; and performing a glass flow process to make said silicon oxide film soften and flow, thereby making said silicon oxide film cover fully said silicon film.

6. A method according to claim 5, wherein said step of forming said silicon oxide comprises the step of forming a BPSG film on said silicon film by a CVD technique.

7. A method according to claim 5, wherein said isotropic dry etching process is performed in a microwave plasma etching apparatus.

8. A method for fabricating a semiconductor integrated circuit device including a semiconductor substrate having surface regions, a plurality of first conductive layers, each of said first conductive layers covered with a first insulating film forming a plurality of first insulating films, and a plurality of diffusion layers in the surface regions of said semiconductor substrate between said first conductive layers, each of said diffusion layers functioning as a second conductive layer, comprising the steps of:

forming a second insulating film over said semiconductor substrate to cover said plurality of diffusion layers and said first insulating films;

forming a silicon film on said second insulating film:

forming a silicon oxide film on said silicon film, said silicon oxide film being doped with impurities;

forming a first etching mask on said silicon oxide film, said first etching mask having first openings that define a pattern of first contact windows;

performing an anisotropic dry etching process to remove portions of said silicon oxide film exposed through said first openings in said first etching mask, thereby exposing the surface of said silicon film;

performing an isotropic dry etching process to remove portions of said silicon film exposed through said openings in said etching mask, thereby causing said silicon oxide film to overhang;

performing an anisotropic dry etching process to remove portions of said second insulating film exposed through said first openings in said first etching mask, thereby exposing the surface of said plurality of diffusion layers, and forming said first contact windows;

removing said first etching mask;

performing a glass flow process to make said silicon oxide film soften and flow, thereby making said silicon oxide film cover fully said silicon film;

forming a plurality of third conductive layers on said silicon oxide film, to contact with said plurality of diffusion layers through said first contact windows;

forming a third insulating film on said silicon oxide film, to cover said plurality of third conductive layers;

forming a second etching mask on said third insulating film, said second etching mask having second openings that define a pattern of second contact windows;

performing an anisotropic dry etching process to remove portions of said third insulating film exposed through said second openings in said second etching mask, to remove portions of said silicon oxide film exposed through said second openings in said second etching mask, thereby exposing the surface of said silicon film;

performing an isotropic dry etching process to remove portions of said silicon film exposed through said second openings in said second etching mask, thereby exposing the surface of said second insulating film;

performing an anisotropic dry etching process to remove portions of said second insulating film exposed through said second openings in said second etching mask, thereby exposing the surface of said plurality of diffusion layers and forming said second contact windows;

removing said second etching mask; and forming a fourth insulating film inside said second contact windows;

forming a plurality of fourth conductive layers on said third insulating film, to contact with said plurality of diffusion layers through said second contact windows.

9. A method according to claim 8, wherein said step of forming said silicon oxide film comprises the step of forming a BPSG film on said second insulating film by a CVD technique.

10. A method according to claim 8, wherein said isotropic dry etching processes are performed in a microwave plasma etching apparatus.

* * * * *